United States Patent
Sobchak et al.

(10) Patent No.: US 8,165,255 B2
(45) Date of Patent: Apr. 24, 2012

(54) MULTIRATE RESAMPLING AND FILTERING SYSTEM AND METHOD

(75) Inventors: Charles LeRoy Sobchak, Davie, FL (US); Mahibur Rahman, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 662 days.

(21) Appl. No.: 12/339,787

(22) Filed: Dec. 19, 2008

(65) Prior Publication Data

US 2010/0158178 A1    Jun. 24, 2010

(51) Int. Cl.
*H04L 7/00* (2006.01)

(52) U.S. Cl. ........ 375/355; 375/350; 375/219; 375/224; 370/242; 708/313; 708/319; 708/300; 708/230

(58) Field of Classification Search ................... 375/355
See application file for complete search history.

(56) References Cited

U.S. PATENT DOCUMENTS

| | | | | |
|---|---|---|---|---|
| 5,249,578 A * | 10/1993 | Karp et al. | | 600/447 |
| 7,239,680 B2 * | 7/2007 | Bui | | 375/350 |
| 7,949,699 B1 * | 5/2011 | Neoh et al. | | 708/313 |
| 2001/0031001 A1 | 10/2001 | Gazsi et al. | | |
| 2003/0052740 A1 | 3/2003 | Salmi et al. | | |
| 2004/0151209 A1 | 8/2004 | Cummings et al. | | |
| 2008/0165907 A1 | 7/2008 | Sobchak et al. | | |
| 2008/0259212 A1 * | 10/2008 | Fukumori | | 348/505 |

* cited by examiner

*Primary Examiner* — Shuwang Liu
*Assistant Examiner* — Lihong Yu

(57) ABSTRACT

A discrete time signal resampling circuit (200). A data sample processing module (260) removes selected samples from a sequential plurality of discrete time signal samples to implement fractional resampling where the data sample processing module stores fewer samples than the number of samples between samples to be removed. A coefficient generator (240) in the resampling circuit generates a sequence of finite impulse response filter coefficients, with each coefficient in the sequence being associated with a respective distinct portion of a plurality of discrete time signal samples. A coefficient multiplier (264) multiplies each of the sequential plurality of finite impulse response filter coefficients by its associated respective distinct portion of the plurality of discrete time signal samples. An adder (236) produces a resampled output sample that consists of a sum of elements of the product vector produced by the coefficient multiplier.

16 Claims, 9 Drawing Sheets

MULTIRATE RESAMPLING AND FILTERING SYSTEM AND METHOD

BACKGROUND

1. Field

This invention generally relates to digital signal processing circuits, and more particularly to multirate digital signal processing circuit architectures.

2. Related Art

Digital signal processing applications, which operate on a sequence of discrete time sampled signal values, are sometimes able to more effectively be implemented with algorithms that process data with a sampling rate different than the initially captured rate. Fractional resampling is a process that receives an input data sequence that is sampled at a first, or input, sample rate and produces an output data sequence that also represents the input data sequence but that has an output sampling rate different that is different than the input sample rate. Fractional resampling generally operates to produce an output sample rate that is related to the input sample rate by an arbitrary, but pre-determined, fraction or ratio that is typically represented as p/q. The resampling ratio p/q indicates that for each "q" input samples, the resampling process produces "p" output samples. Undesirable aliasing in the output data sequence is often handled by a Finite Impulse Response (FIR) low-pass filtering process at an appropriate point in the resampling process.

Some conventional methods of fractional resampling utilize an FIR resampling filter with a filter length that is greater than the number of samples for the given rate change. Such a filter does not predicatively generate output samples beyond its own filter length. For certain scenarios when q is much greater than p, the filter length can become large. An alternative to a single resampling filter incorporates a series of m filters, where the resampling rate for each filter of is, for example (q−1)/q. Some resampling processes incorporating these conventional designs incorporate one or both of these alternatives.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
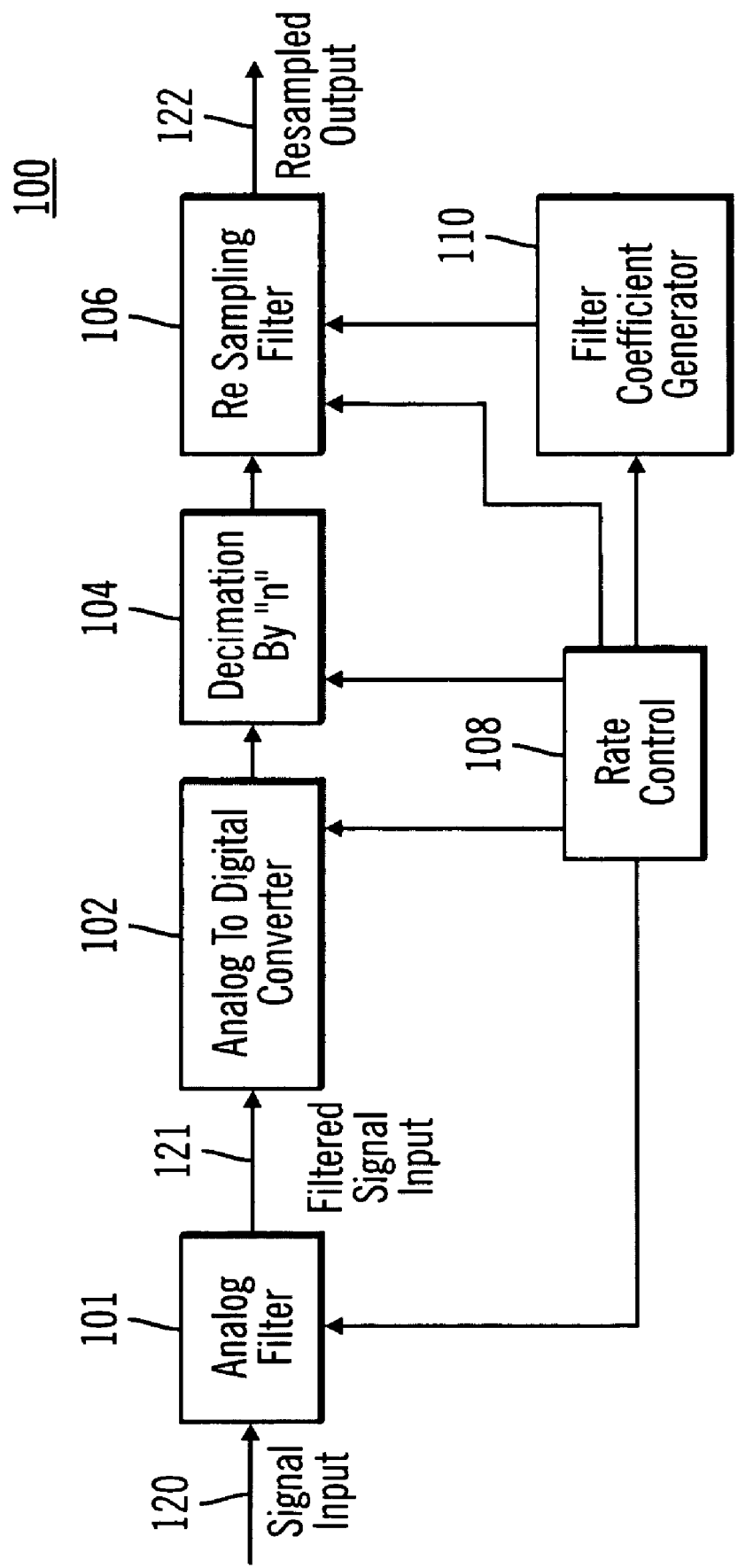
FIG. 1 illustrates a functional block diagram of a programmable resampling processor in accordance with one embodiment of the invention.

One embodiment of the present invention incorporates a method for fractional resampling by a rate of p/q where q−p is greater than the length of the resampling filter. In one embodiment, a method uses a single filter whose length is not a function of the number of samples of an input signal that are to be processed in reducing the data clock rate of the input signal. One application of an embodiment of the present invention is a fractional resampling method for a signal processor to be used in a reconfigurable 3G and Long Term Evolution (LTE) data receiver. One embodiment of the present invention allows circuitry for a single Finite Impulse Response (FIR) filter to be reconfigured to support efficient processing of 6 channel bandwidths utilized by, for example, LTE data communications systems as well as 3G data communications systems.

One embodiment of the present invention processes received 3G and LTE signals through an analog receiver whose filtering bandwidth is controlled to maintain a substantially constant magnitude response over the desired signal modulation bandwidth. The analog signal is received by using a single A/D converter configurable to operate at two sampling rates to capture discrete time signals. These captured discrete time signals are then resampled to maintain a substantially constant signal modulation bandwidth to sampling rate ratio ($F_{bw}/F_s$) as well as maintaining the constant analog and digital composite magnitude response over the desired signal modulation bandwidth. A data communications receiver that is able to process a variety of received waveforms with varying signal bandwidths is able to efficiently reuse processing circuitry by presenting the received signal with constant $F_{bw}/F_s$ regardless of the bandwidth of the received signal. Processing that benefits from using a constant $F_{bw}/F_s$ includes, for example, automatic gain control processing, coarse dc offset correction, fine dc offset correction, magnitude and phase equalization, digital automatic gain control and other such processing. Further benefits provided by a discrete time processor that maintains a constant $F_{bw}/F_s$ includes an ability to use a single fixed equalizer, or matched selectivity filter, that has a goal of insuring that the composite analog and digital filtering matches a specific response and/or meets certain selectivity requirements. An example of such a selectivity requirement include, for example, implementing a square root raised cosine filter response with alpha=0.22 when processing 3G signals. Yet further benefits include having a fixed equalizer, rather than requiring a programmable equalizer, that can be implemented in CSD (canonical signed digit) to realize an implementation with less circuit area and current drain than would be required for a fully programmable equalizer with coefficients that would be changed for each channel bandwidth.

One embodiment of the present invention initially processes received signals with an analog low-pass filter that supports adjustment of the analog filter poles and zeros to maintain a substantially constant magnitude response over the desired signal modulation bandwidth of the signal being processed. Thus, when processing signals with any of the possible received channel bandwidths, such as, for example, 20 MHz, 15 MHz, 10 MHz, 5 MHz, 3 MHz, 1.4 MHz or 3G, the analog filters poles and zeros are adjusted to maintain a similar 3 dB corner (and magnitude response) relative to the channel bandwidth of the signal being processed.

One embodiment of the present invention utilizes an A/D converter that is configured to sample signals at either 208 MHz or 104 MHz and then performs a decimation by n (or by n*m) followed by fractional resampling to maintain substantially equal $F_{bw}/F_s$ ratios for processing of LTE signals with received bandwidths of, for example, 20 MHz, 15 MHz, 10 MHz, 5 MHz, 3 MHz and 1.4 MHz, and also processing of 3G signals with a channel bandwidth of 3.84 Mhz. In one embodiment of the present invention, an initial decimation filter is implemented as a comb filter, or as a Cascaded Integrator-Comb (CIC) filter, that decimates by n (where n=3, 4, 6, 7, 10, 25). This initial decimation filter is then followed by a half band FIR filter that is decimated by m. In one embodiment, m=2.

One embodiment of the present invention, as described below, includes a resampling processor that incorporates a single 5 tap FIR filter that does not use an intermediate data clock. Such an embodiment reduces circuit area and current drain compared to previously described techniques.

FIG. 1 illustrates a functional block diagram of a programmable resampling processor 100 in accordance with one embodiment of the present invention. The programmable resampling processor 100 receives an analog signal input 120, which in one embodiment of the present invention consists of an intermediate frequency or baseband signal representation of a received wireless communications signal. One embodiment of the present invention is able to be adjusted to efficiently process several different modulation formats and bandwidths used in various wireless digital data communications. For example, one embodiment is able to configure the components illustrated in FIG. 1 to efficiently process the several signal bandwidths of received LTE and 3G digital communications signals, as is described above.

The analog signal input 120 is processed by an analog filter 101 that performs suitable anti-aliasing low-pass filtering of the analog signal input 120. The analog low-pass filter 101 of one embodiment supports adjustment of its analog filter poles and zeros to maintain a substantially constant magnitude response over the desired signal modulation bandwidth of the signal being processed.

In one embodiment, a filtered analog signal input 121 is produced by the analog low pass filter and is received by an analog to digital converter 102. The analog to digital converter 102 of one embodiment is able to be configured to sample the input signal at one of several sampling rates. One embodiment of the present invention is able to configure the analog to digital converter 102 to sample the input signal at either 208 MHz or 104 MHz.

The digital samples produced by the analog to digital converter 102 of one embodiment are then provided to a decimation by "n" processing block 104. The decimation by "n" processing block 104 of one embodiment is able to be configured to provide a properly filtered and conditioned down-sampled output that is decimated at a rate of n. In one embodiment, the decimation by "n" processing block 104 receives a discrete time signal sample sequence and periodically removes a specified number of samples from the discrete time signal sequence. That is to say that the output of the decimation by "n" processing block 104 has one sample for every n input samples. For example, configuring "n" to be eight (8), the output of the decimation by "n" processing block 104 has one sample for every 8 input samples. One embodiment of the present invention allows the decimation by "n" processing block 104 to be configured with values of "n" equal to one of 3, 4, 7, 6, 10 and 25. In one embodiment, the value of "n" is set by the rate control 108, which is described below.

The programmable resampling processor 100 includes a rate control 108 that controls, among other things, the resampling ratio implemented by the programmable resampling processor 100. The rate control 108 controls the magnitude response and 3 dB corner frequency of the analog filter 101, the decimation ratio implemented by the decimation by "n" processing block 104 and also controls the configuration of the resampling filter 106 and the filter coefficient generator function 110, as is described in detail below.

In one embodiment of the present invention, a data sample processing module, such as the resampling filter 106, is configurable, in response to a resampling control signal, to perform the fractional resampling at a plurality of resampling rates. The analog to digital converter 102 is adapted to adjust, in response to the resampling control signal, a sampling rate for the discrete time signal sequence. The analog filter 101 has a bandwidth adjustable in response to the resampling control signal. A decimation circuit in the decimation by "n" processing block 104 adjusts the specified number of samples to be periodically removed based upon the resampling control signal, and the filter coefficient generator 110 generates a sequential plurality of finite impulse response filter coefficient sets in response to the resampling control signal. In one embodiment, a single control signal changes the bandwidth of the analog filtering line-up, digital decimation ratio and resampling filter.

The programmable resampling processor 100 of one embodiment further includes a resampling filter 106 that efficiently performs fractional rate resampling of the data samples produced by the decimation by "n" processing block 104. As described in detail below, the resampling filter 106 of one embodiment implements a Finite Impulse Response (FIR) discrete time filter that receives resampling filter coefficients produced by the filter coefficient generator 110. The resampling filter 106 produces a resampled output 122, which is a properly filtered and conditioned representation of the analog signal input 120 that has been resampled at a second clock rate.

The filter coefficient generator 110 of one embodiment implements a coefficient generator that generates a sequential plurality of finite impulse response filter coefficient sets. Each coefficient set within the sequential plurality of finite impulse response filter coefficient sets is associated with a respective distinct portion of a plurality of discrete time signal samples of the analog signal input 120 that consists of a filter length number of samples.

Figure 2:
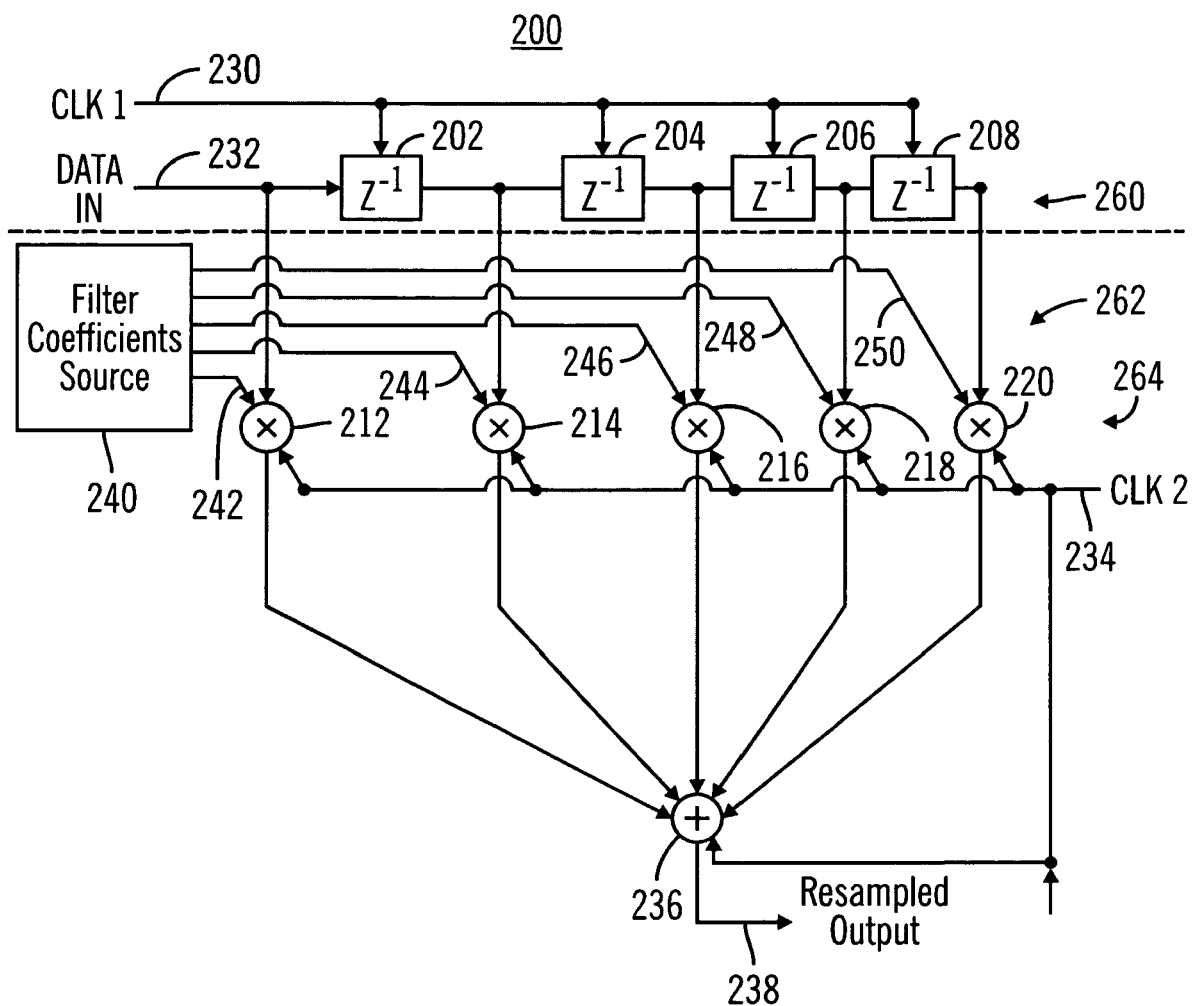
FIG. 2 illustrates a detailed functional block diagram of a discrete time processor that corresponds to the resample filter illustrated in FIG. 1, in accordance with one embodiment of the invention.

FIG. 2 illustrates a detailed functional block diagram of a discrete time processor 200 that corresponds to the resample filter 106 illustrated in FIG. 1, in accordance with one embodiment of the invention. The discrete time processor 200 of one embodiment of the present invention is a processing module that is able to be implemented as a dedicated digital hardware circuit, a programmable processor configured to execute operational software, or a combination of dedicated hardware circuits and programmable processors. The discrete time processor of one embodiment includes a processing module based implementation of a Finite Impulse Response (FIR) filter that is divided into two portions, a delay line shift register 260 with components that operate at a first clock rate provided by the CLK1 signal 230, and a coefficient/adder section 262 that operates at a second clock rate provided by the CLK2 signal 234. In one embodiment of the present invention, as is described below, the CLK2 signal 234 is synthesized by gating selected pulses of the CLK1 signal 230. In one embodiment, the CLK1 signal 230 operates at the sample rate of the Data In signal 232 and the CLK2 signal 234 operates at the desired output clock rate for the resampled output 238. For example, in one embodiment, the multipliers of the coefficient/adder section are effectively clocked at the CLK2 rate by holding (e.g., feeding the same input data into each multiplier via an additional shift delay line), or zeroing the data when gating the selected pulses of CLK1.

The discrete time processor 200 of one embodiment implements an Finite Impulse Response (FIR) filter that is able to have different filter coefficients defined for each sample being processed. In one embodiment, the filter coefficients are determined and stored in a filter coefficient generator 110, described above. The filter coefficient generator 110 provides filter coefficients to a filter coefficient source 240, as is described in detail below.

The delay line shift register 260 of one embodiment operates as a data sample processing module that is adapted to remove selected samples from the Data In signal 232, i.e., a sequential plurality of discrete time signal samples, to implement fractional resampling. In one embodiment, fractional resampling is performed by removing selected samples that are separated from each other in the Data In signal 232 by an inter-removal sample count. In one embodiment, the data sample processing module stores a filter length number of samples that corresponds to the length of delay line shift register 260, which is less than the inter-removal sample count.

The delay line shift register 260 of one embodiment includes a five stage delay line that includes a first delay element 202, a second delay element 204, a third delay element 206, and a fourth delay element 208. The first delay element 202 receives and delays a discrete time Data In signal that has a signal clock rate equal to the first clock rate provided by the CLK1 signal 230. These discrete time samples then propagate through the subsequent delay elements based upon the clocking provided by the CLK1 signal 230.

The discrete time processor 200 of one embodiment performs an FIR low pass filter to properly condition the received discrete time signal to be properly represented at an output sample rate that corresponds to the second clock frequency of CLK2. In one embodiment, CLK2 is fractionally related to CLK1. One embodiment incorporates a discrete time processor 200 that is configurable to perform fractional resampling with fractions of $^{144}/_{325}$, $^{168}/_{325}$, $^{192}/_{325}$, $^{120}/_{325}$, and $^{150}/_{325}$.

One embodiment of the present invention implements an FIR filter by clocking the delay line shift register 260 with the CLK1 signal and by clocking coefficient multipliers 264 and adder 236 with the CLK2 signal. The coefficient multipliers 264 of a discrete time processor 200 of one embodiment include five coefficient multiplier elements, a first coefficient multiplier element 212, a second coefficient multiplier element 214, a third coefficient multiplier element 216, a fourth coefficient multiplier element 218, and a fifth coefficient multiplier element 220. Each coefficient multiplier element receives a data value from a respective tap of the delay line shift register 260. Each coefficient multiplier also receives a respective coefficient value that is provided by a filter coefficient source 240, such as the filter coefficient generator 110. The first coefficient multiplier element 212 receives a first coefficient 242, the second coefficient multiplier element 214 receives a second coefficient 244, the third coefficient multiplier element 216 receives a third coefficient 246, the fourth coefficient multiplier element 218 receives a fourth coefficient 248, and the fifth coefficient multiplier element 220 receives a fifth coefficient 250. Each coefficient multiplier multiples its coefficient by the data value received from its respective delay line tap. The products produced by each of these coefficient multiplier elements are then summed together by adder 236 to produce a resampled output 238. In one embodiment, the adder 238 is clocked by the same clock as the coefficient multipliers, i.e., CLK2 234, which operates at the desired output data clock rate.

One embodiment of the present invention utilizes resampling filter coefficients that are used by the coefficient multipliers 264 such that the filter coefficients are changed for each cycle of CLK2 234. The operation of one embodiment of the present invention that uses a sequence of resampling filter coefficients that are changed according to the input data sample being processed allows efficient resampling of a discrete time signal data stream by properly incorporating removed samples from the input discrete time signal data stream into the lower rate output discrete time signal data stream.

One embodiment of the present invention implements coefficient multipliers that sequentially multiply each coefficient set within the sequential plurality of finite impulse response filter coefficient sets, which define one filter to be applied to a portion of the Data In signal 232, by the respective distinct portion of the plurality of discrete time signal samples that are associated with that filter. One embodiment further includes an adder 236 adapted to produce a resampled output sample that consists of a sum of elements of a product vector produced by the coefficient multiplier 264.

One embodiment of the present invention calculates the sequence of filter coefficients by defining a series of low pass filters to properly condition the resampled data stream. Each input sample of the input discrete time signal data stream is processed with a different low pass filter within that sequence. One embodiment defines low pass filters with similar, but not necessarily identical, magnitude vs. frequency characteristics, but with different group delay characteristics depending upon the number of the sample within the discrete time input signal sequence that is being processed.

In one example, a sequence of resampling filters is created by first defining a low pass filter with a selected initial group delay for the first sample to be processed. Resampling filters to be used in processing subsequent samples of the discrete time input signal are then defined to have increasing group delays for each subsequent sample being processed. The group delay of each filter in the sequence is increased until reaching the resampling filter that corresponds to the input sample that is "skipped" to achieve the desired resampling. Once encountering the filter corresponding to the input symbol that is skipped, the group delay of subsequent resampling filters is reset to a selected value to allow for subsequent incrementing with each subsequent input sample. Upon skipping an input sample, the group delay of the resampling filter is able to, and does, account for this skipped sample, thus keeping the resampling FIR filter group delay near the center coefficient of the FIR filter delay line structure. In one embodiment, the group delay is reset by reducing the group delay by an amount that corresponds to a total increase in group delay of filters that are associated with discrete time signal samples occurring between the selected samples that are removed or skipped.

In one embodiment, a control signal is able to indicate a change in the resampling rate to be performed by the resampling filter. In response to receiving a control signal specifying a rate change, the filter coefficient generator 110 of one embodiment generates a new sequential plurality of finite impulse response filter coefficient sets corresponding to the change in resampling rate.

One example of an embodiment of the present invention incorporates a discrete time processor 200 that performs resampling with a fractional resampling rate of $288/325$. A resampling filter with five (5) taps is used to implement a low pass filter with a magnitude response suitable to condition the resampled output discrete time signal. In this example, there is a sequence of 288 filters that have 288 corresponding filter coefficients (for a relatively small 5 tap filter), with each filter of the sequence having a group delay advanced by a variable amount either of either 0.1285 (37/288), or −0.8715 (−251/288).

The amount of group delay change in one embodiment is calculated according to one of two equations depending upon the stage of processing being performed. A first equation is $(q-p)/q$, which in the above described example of a 288/325 resampling ratio yields $(325-288)/325$, is used when not skipping an input sample. A second equation is used to calculate the change in group delay relative to a previously processed sample when an input sample being processed by the resampling filter is "skipped." Following the "skipping" of an input sample, the second equation that is used is $((q-p)/q)-1$, which yields $((37/325)-1)$ in this example of a 288/325 resampling ratio. The group delay calculated by the second equation is used on the sample iteration following a "skipped" input sample, i.e., an input sample for which no output sample is produced. The input sample is "skipped" in that there is no output of the resampling FIR filter 106 for that input sample. Since the resampling FIR filter 106 has memory, the "skipped" sample is used in processing input samples in the vicinity of the "skipped" samples, i.e., in future or previous iterations of resampling filter processing because the "skipped" input sample is still inside the FIR filter memory.

Figure 11:
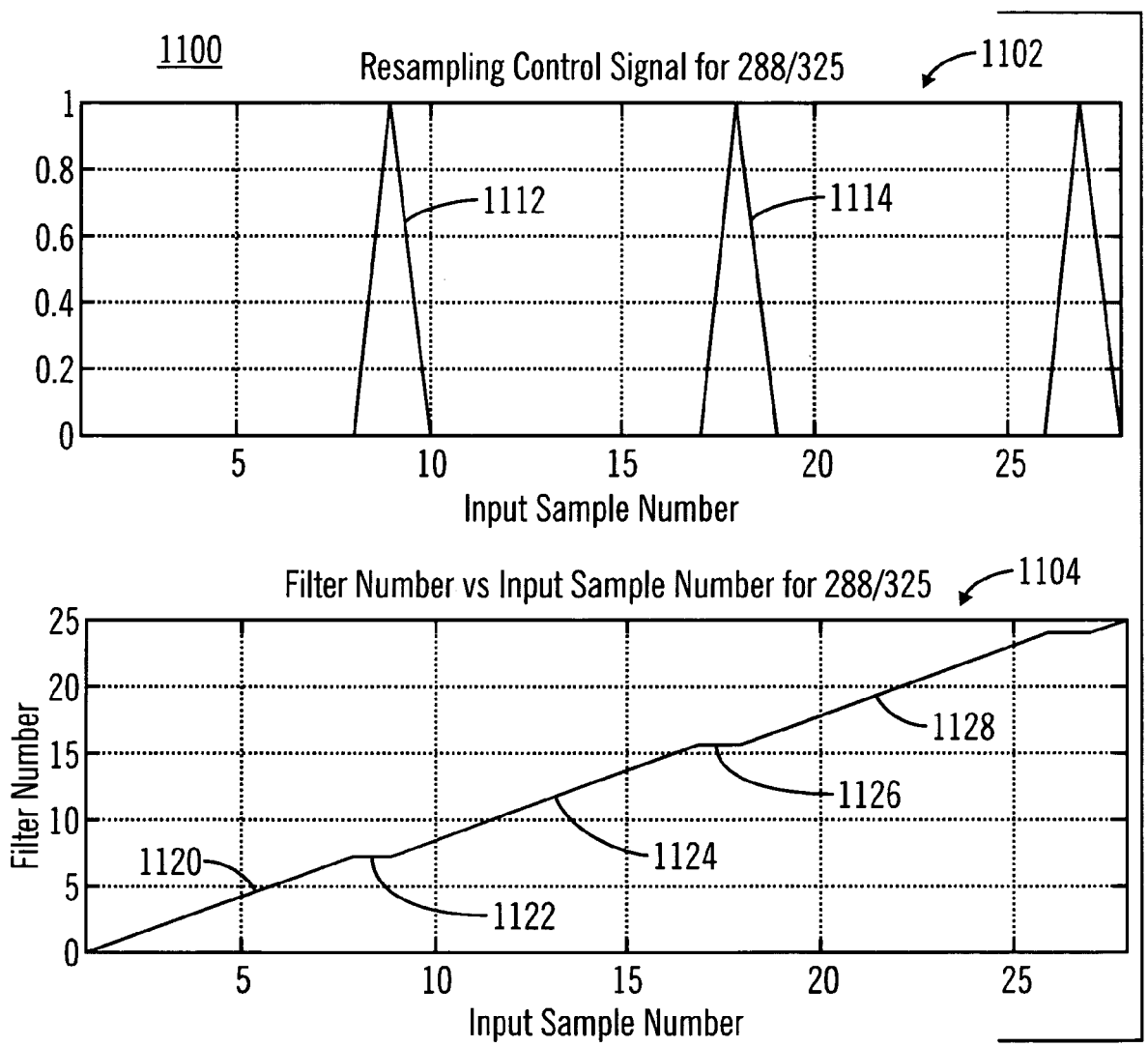
FIG. 11 illustrates a resample control signal and filter number to input sample relationship, in accordance with one embodiment of the present invention.

FIG. 11 illustrates a resample control signal and filter number to input sample relationship 1100, in accordance with one embodiment of the present invention. The resample control signal and filter number relationship 1100 illustrates a resampling control signal 1102 and a filter number vs. input sample relationship 1104. The resampling control signal 1102 is shown in this example to be asserted at, for example, samples 9, 18, and 27. The portion of the resampling control signal 1102 illustrated in FIG. 11 includes a first pulse 1112 occurring at input sample 9 and a second pulse 1114 occurring at input sample 18. As discussed in this specification, the resampling control signal 1102 repeats for subsequent input samples with a similar pattern. In one embodiment, the resampling control signal 1102 is asserted to coincide with an input sample clock cycle that is not to have a corresponding output from the resampling filter 106.

The filter number vs. input sample relationship 1104 illustrates the filter number that is selected to be used to process corresponding input samples. A first portion of the filter number vs. input sample relationship 1104 illustrates a first portion 1120 that is a monotonically increasing relationship where each new input sample is processed with the next filter number. The first portion 1120 ends upon the assertion of the first pulse 1112 of the resampling control signal 1102 where no filter is used to process the input sample that is "skipped" by the processing of one embodiment of the present invention. During assertion of the first pulse 1112, a first skipped filter portion 1122 of the of the filter number vs. input sample relationship 1104 indicates that there is no increase in filter number during the "skipped" input sample.

After assertion of the first pulse 1112 of the resampling control signal 1102, a second portion 1124 of the filter number vs. input sample relationship 1104 represents another monotonically increasing relationship where each new input sample is processed with the next filter number. However, during the second portion 1124, the filter number is one less than the input sample number since a filter was not specified for use during the "skipped" input sample corresponding to the first pulse 1112, i.e., sample number 9 in this example.

After the second portion 1124 of the filter number vs. input sample relationship 1104, a second skipped filter portion 1126 of the of the filter number vs. input sample relationship 1104 indicates that there is no increase in filter number during the second "skipped" input sample that occurred during assertion of the second pulse 1114. Following the assertion of the second pulse 1114 of the resampling control signal 1102, a third portion 1128 of the filter number vs. input sample relationship 1104 represents another monotonically increasing relationship where each new input sample is processed with the next filter number.

In one embodiment, the skipping of an input sample is determined by the resampling control signal. The group delay of the resampling filter of one embodiment of the present invention is adjusted to accommodate the skipping of an input sample. For example, if +1 sample is added to the group delay of the input signal by skipping the input sample, 1 sample is subtracted from the group delay of the resampling filter to insure that the output signal is still progressing at the proper CLK2 rate (assuming CLK2<CLK1). A benefit of this group delay determination processing is that it also allows the resampling filter to maintain a group delay of approximately +/−0.5 samples from the center tap of the resampling FIR filter. In an example where the length of the resampling filter is L, where typically the group delay would be (L−1)/2, the group delay of the resampling filter 106 is maintained between $((L-1)/2)-0.5$ and $((L-1)/2)+0.5$. A sequence of five filter coefficients for each of the 288 filters to be used to process a discrete time input forms a filter coefficient array that is pre-calculated in one embodiment and that is provided to the coefficient multipliers 264 with one row of five coefficients for each input sample.

In one embodiment, the multipliers 264 of the coefficient/adder section 262 are effectively clocked at the CLK2 rate by, for example, holding (e.g., feeding the same input data into each multiplier via an additional shift delay line), or zeroing the data during assertion of the resampling control signal.

The operation of one embodiment of the present invention operates, in a sense, by skipping an input sample and adjusting the group delay of the filter that in the matrix accordingly. As can be seen in the output of the resampling there are no discontinuities and this 5 tap resampling filter is able to change the frequency from 34.66 MHz to 30.72 MHz.

Figure 3:
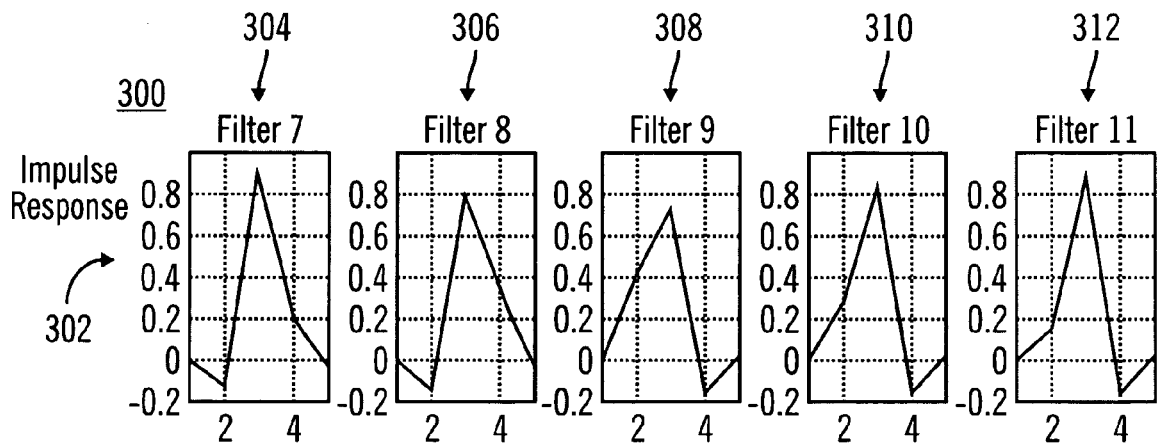
FIG. 3 illustrates impulse responses of a sequence of resampling filters implemented by the discrete time processor of FIG. 2, in accordance with one embodiment of the present invention.

FIG. 3 illustrates impulse responses 300 of a sequence of resampling filters implemented by the discrete time processor of FIG. 2, in accordance with one embodiment of the present invention. The impulse responses 300 illustrate the impulse response of five of the 288 filters for the 288/325 example, an impulse response for filter 7 304, an impulse response for filter 8 306, an impulse response for filter 9 308, an impulse response for filter 10 310, and an impulse response for filter 11 312. The impulse response for each of the filters represented in the impulse responses 300 represent the impulse response for a respective filter that is used for processing a respective input sample of the discrete time input signal 232 described above. The impulse response for Filter 7 304 corresponds to the filter used to process the seventh sample of the discrete time input signal 232. Filter 8, 9, 10 and 11 are similarly used to process the eighth, tenth, and eleventh sample of the discrete time input signal.

In this example, the output of the FIR resampling filter 106 is "skipped" when the ninth input sample arrives at the FIR resampling filter 106. In this description, "skipped" only refers to the processing that suppresses an output of the resampling filter 106 when processing an input sample. The "skipped" sample is retained in the FIR filter structure to be used when producing output samples in the vicinity of that "skipped" sample. When the tenth input sample arrives at the FIR filter, one embodiment uses the ninth set of coefficients for the filter processing. In such embodiments, the ninth set of coefficients account for the group delay of the "skipped" input sample. As each sample of the discrete time input signal 232 is received, the filter coefficients source 240 provides the filter coefficients to the FIR filter implemented by the discrete time processor 200 to implement the respective filter with the desired impulse responses, such as those illustrated by the impulse responses 300 for samples 7 through 11. In this example, input sample 9 corresponds to the input sample that is skipped and therefore results in no output of the FIR filter.

The sequence of filters illustrated in the impulse responses 300 shows that as the filter number increases, the peak of the impulse response shifts, by 37/288 sample, thus advancing the output samples. In this example, filter 7 304 and filter 8 306 have increasing group delay. Filter 9 308, however, moves in the opposite direction (i.e., a negative group delay from the previous filter 8 306). Filter 10 310 and filter 11 312 then continue to be incremented by 37/288 starting from filter 9's group delay. Filter 9 308 is used to process samples after the resampling filter is held to disable an output during the clock cycle when the skipped sample is received and thus allows the FIR resampling filter to skip, or jump over, one input sample. This relationship is illustrated by the resample control signal and filter number to input sample relationship 1100, described above.

Figure 4:
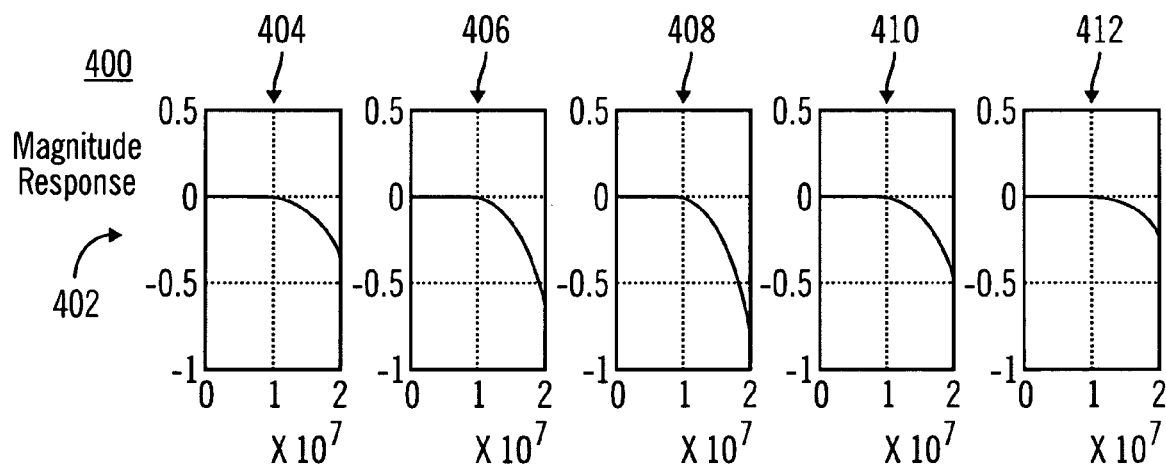
FIG. 4 illustrates magnitude responses of a sequence of resampling filters implemented by the discrete time processor of FIG. 2, in accordance with one embodiment of the present invention.

FIG. 4 illustrates magnitude responses 400 of a sequence of resampling filters implemented by the discrete time processor of FIG. 2, in accordance with one embodiment of the present invention. The magnitude responses 400 illustrate that the magnitude responses for the sequence of filters is flat for the bandwidth of the signal being processed. In one example, e.g., an LTE signal, the one-sided bandwidth is 9 MHz. In one embodiment, the resampling filters created to process the input discrete time signal may have varying bandwidth and roll-off characteristics, but the bandwidth generally stays a minimum distance from the desired corner (as seen in filter 8 408).

Figure 5:
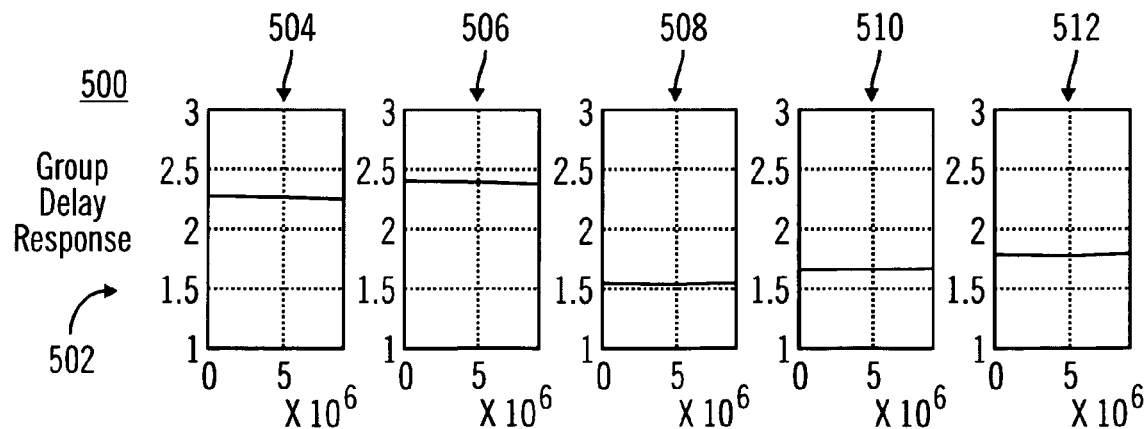
FIG. 5 illustrates group delay responses of a sequence of resampling filters implemented by the discrete time processor of FIG. 2, in accordance with one embodiment of the present invention.

FIG. 5 illustrates group delay responses 500 of a sequence of resampling filters implemented by the discrete time processor of FIG. 2, in accordance with one embodiment of the present invention. The group delay responses 500 illustrate group delay responses for the sequence of resampling filters illustrated in the impulse responses 400. The group delay responses illustrate that the group delay for filter 7 504 and filter 8 506 are advancing at a rate of 37/288 samples. The group delay for filter 9 508 is then shown to leap backwards relative to filter 8 506. In one embodiment, the filter 9 508 has a group delay that is less than 251/288 samples relative to filter 8 506. Finally filter 10 510 and filter 11 512 show that the group delay again advances relative to the group delay of filter 9 508 at a rate of 37/288 samples. One embodiment of the present invention is able to implement an efficient FIR resampling filter with a shorter delay line length due to the leaping, or skipping, of periodic samples in filter 9 508.

Resampling filters with shorter delay lines, for example $L<8$ where L is the length of the filter, generally provide better performance when the group delay of the filter is close to $(L-1)/2$. One embodiment of the present invention operates to create the sequence of resampling filters such that the group delay remains between $(L-1)/2+/-0.5$. Such a characteristic allows using a small filter as opposed to using either an extremely long resampling filter or using 2 resampling filters in sequence. One embodiment of the present invention uses control logic to ensure that the proper input sample is skipped at the correct time.

An example of one embodiment of the present invention implements a $288/325$ fractional resampling processor where the output data stream contains 288 samples for each 325 samples received by the filter's input. In this example, a sequence of resampling filters, and a corresponding sequence of resampling filter coefficients, is defined to be used for processing the sequence of input discrete time samples. The sequence of resampling filters of one embodiment consists of a sequence of FIR filters with group delays that increase for each filter in the sequence by 37/288 of a sample advancements per tap until the group delay of a filter in the sequence has increased by 1 full sample. Once the group delay in this example has increased by an additional 1 sample ahead, the advancement of group delay increase for the filter sequence shifts from a 37/288 advancement to a −251/288 delay, i.e., 1−37/288.

One embodiment of the present invention selects a point within the sequence of resampling filters to switch the group delay to a negative advancement, and thereby skip an input sample, so as to keep the group delay of all of the filters within the sequence of resampling filters between $(L-1)/2+/-0.5$. One embodiment uses this criterion to determine the sample number of the input discrete time signal at which a control signal is generated to skip an input sample when creating an output sample. Once the time of the control signal is determined, the desired group delay is able to be determined at each time instant relative to the control signal. The generated resampling filter coefficients are then determined based on these desired group delays for the sequence of resampling filters.

Figure 6:
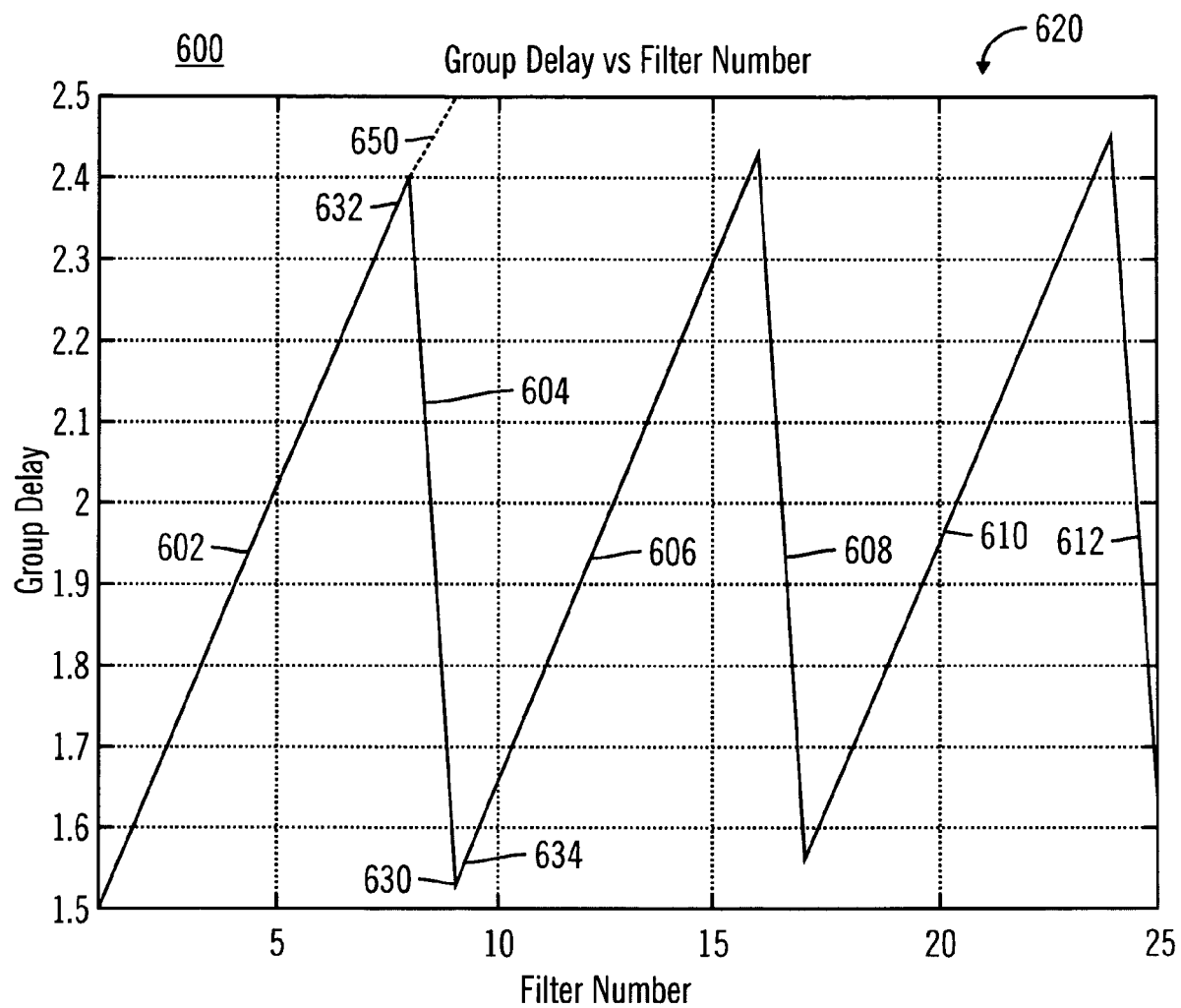
FIG. 6 illustrates a resampling filter group delay versus input sample being processed, in accordance with one embodiment of the present invention.

FIG. 6 illustrates a resampling filter group delay versus input sample 600 of the sample being processed, in accordance with one embodiment of the present invention. The resampling filter group delay versus input sample 600 illustrates a traditional group delay 610 of a conventionally used "long" FIR resampling filter, which would have, for example, a delay line with at least 37 taps. The traditional group delay 610 is shown to be continually increasing as the number of the sample being processed increases.

The resampling filter group delay versus input sample 600 further shows a modified group delay progression 620 for a sequence of resampling filters that is, for example, implemented by the discrete time processor of FIG. 2. The modified group delay progression 620 includes the group delays described above for filter 7 504, filter 8 506, filter 9 508, filter 10 510 and filter 11 512, as are described above for the appropriate sample, or filter, number. The group delay for filter 7 504 is illustrated at sample 7 632. The leap backwards in group delay for filter 9 508 is illustrated as a first decrease 604 in the modified group delay progression 620 with the value of filter 9 508 illustrated at a second point 630. The increasing group delay after filter 9 508 is also illustrated with, for example, the group delay filter 11 512 being illustrated at a third point 634.

The resampling filter group delay versus input sample 600 shows a modified group delay progression includes several decreases in group delay that correspond to input samples being skipped by the resampling filter. The first decrease 604 is shown to occur with input sample 10, which is after the skipped sample, sample number 9 in this example. The first decrease 604 in group delay occurs for filter 9 508, which is a filter immediately subsequent to filter 8 506, where filter 8 is applied prior to remove of a first selected sample and filter 9 is applied immediately after the removal of the first selected sample. A second decrease 608 occurs after the second increasing ramp 606 at input sample 18, which corresponds to another skipped sample. The second decrease 608 is followed by a third increasing ramp 608, which continues to the skipped sample at sample number 27, where a third decrease 612 occurs. In this example, input samples 9, 18, 27, 36 and 44 result in no output of the resampling filter (i.e., they are referred to herein as "skipped"). The input samples that follow these input samples, e.g., input samples 10, 19, 28, 37 and 45, result in outputs using filters 9, 17, 25, 33 and 40. In one embodiment operating with a resampling ratio of 288/325, there are 288 filters that are used to process 325 input samples. The modified group delay progression 620 is shown to include an initial group delay ramp 602 that coincides with the traditional group delay 610 until the first skipped sample is encountered, such as sample 9 in this example. Once a skipped sample is encountered, one embodiment of the present invention modifies the group delay progression of the FIR resampling filter to accommodate the skipped sample.

Figure 7:
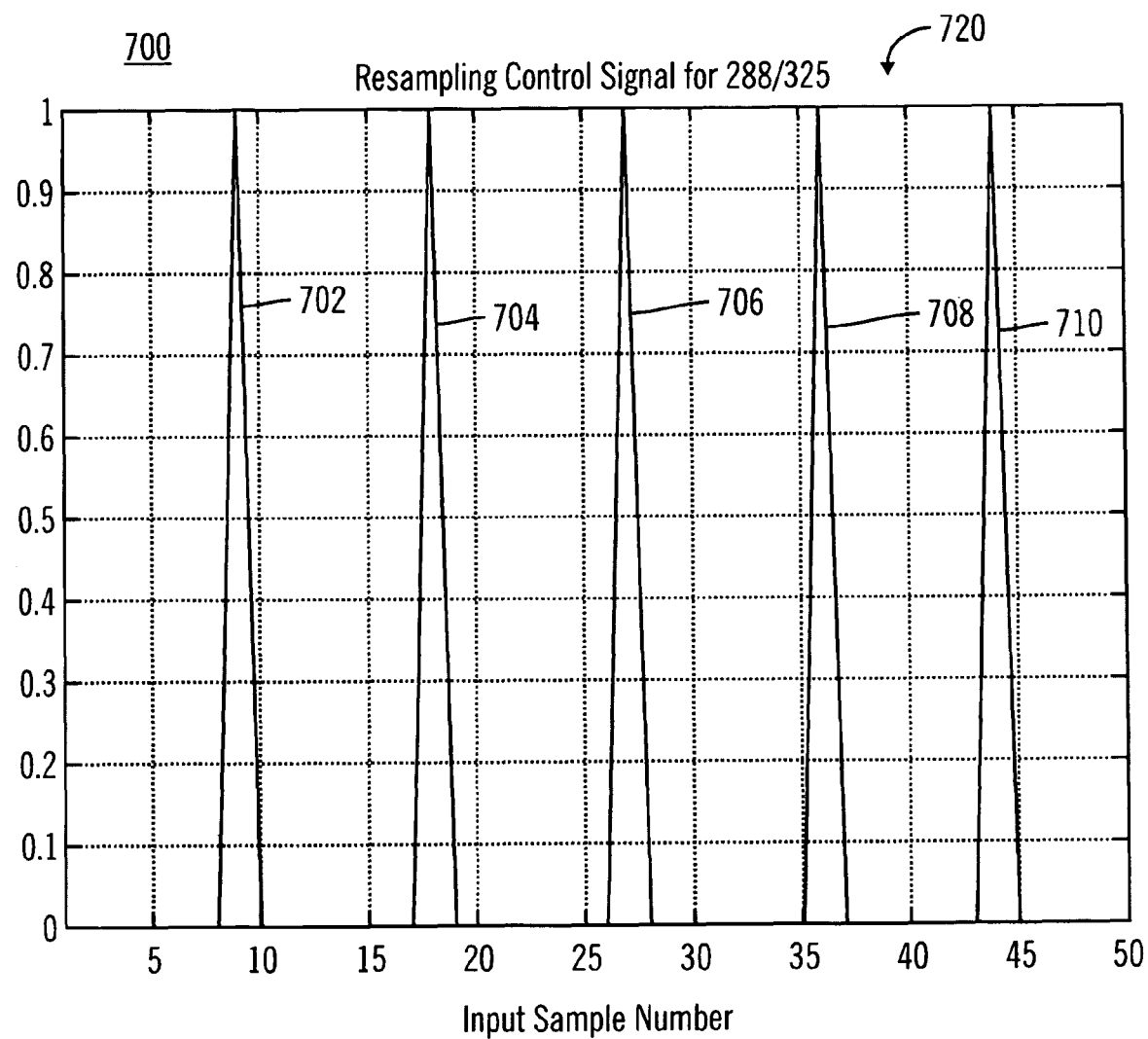
FIG. 7 illustrates a resampling control signal for a 288/325 resampling ratio, in accordance with one embodiment of the present invention.

FIG. 7 illustrates a resampling control signal 720 for a 288/325 resampling ratio as applied to the discrete time processor of FIG. 7, in accordance with one embodiment of the present invention. The resampling control signal 720 of one embodiment is used to control the generation of dithered clocks that only has edges as a function of the resampling control signal. This resampling control signal is also used in the loading of data into, for example, circuits receiving the resampled output 122. The resampling control signal 720 in this example with a 288/325 resampling ratio occurs at every eight or ninth input sample to create the initial resampling control signal pulse train illustrated by a first resampling pulse 702 at input sample 9, a second resampling pulse 704 at input sample 18, a third resampling pulse 706 at input sample 27, a fourth resampling pulse 708 at input sample 36, and a fifth resampling pulse 712 at input sample 44

Figure 8:
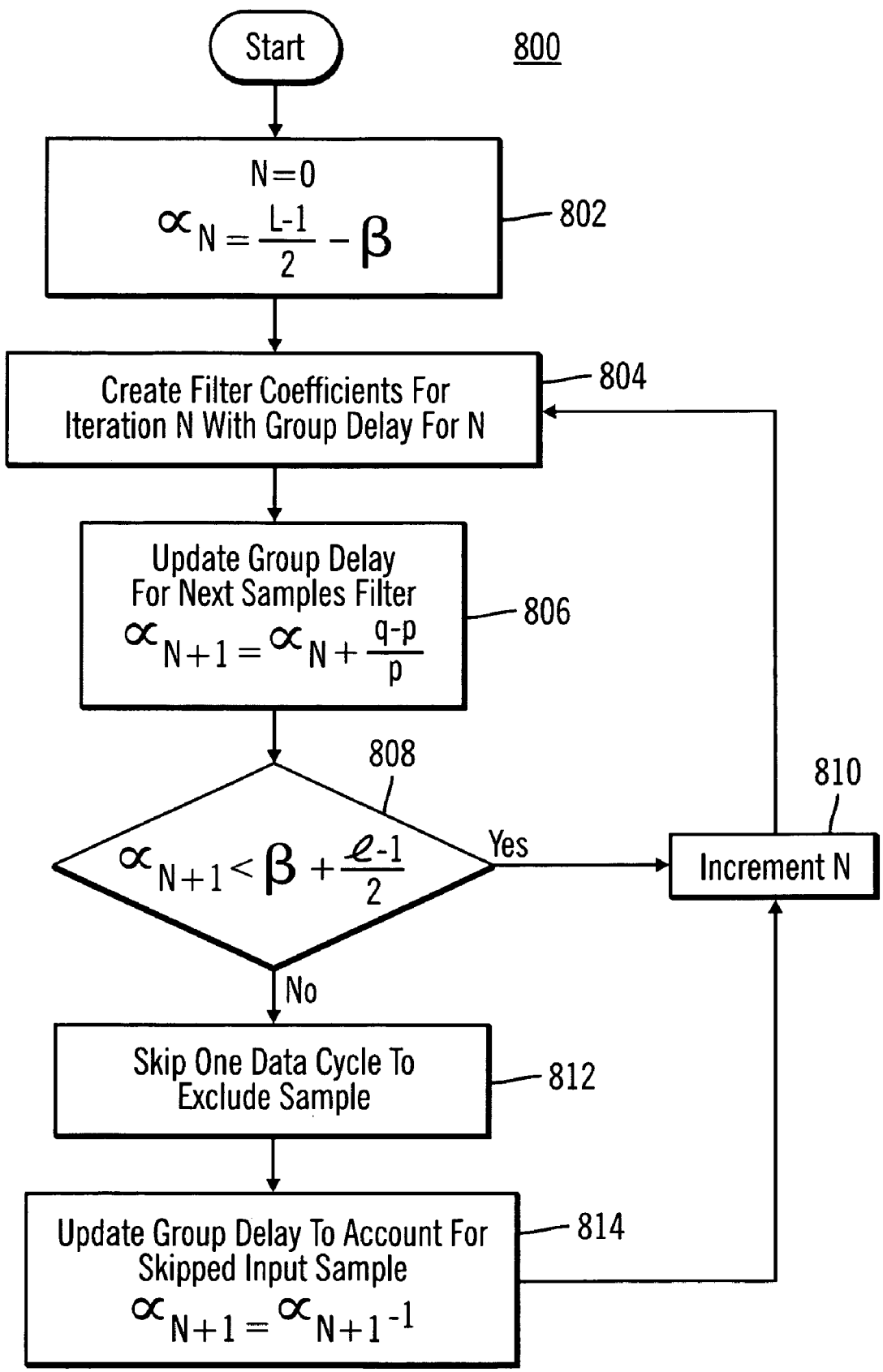
FIG. 8 illustrates a resampling filter coefficient sequence calculation process, in accordance with one embodiment of the present invention.

FIG. 8 illustrates a resampling filter coefficient sequence calculation process 800, in accordance with one embodiment of the present invention. The resampling filter coefficient sequence calculation process 800 illustrates one example of the calculation and determination of the filter coefficients provided by the filter coefficient source 240, described above. In one embodiment, the processing illustrated for the resampling filter coefficient sequence calculation process 800 is performed during operations of a programmable resampling processor 100, as is described above. The resampling filter coefficient sequence calculation process 800 begins by setting, at step 802, the sample number "N" to zero (0) and initializing the group delay value for the filter to be used to process the first sample of the discrete input signal 232. In one embodiment, the initial group delay is set according to the following formula (let's update the flow chart to use):

$$\alpha_n = \frac{L-1}{2} - \beta$$

Where p/q is the fractional resampling rate, "L" is the length of the resampling filter, and β is chosen to be 0.5. The value of β corresponds to the amount by which the group delay of the filter will vary around the center tap of the FIR filter. Alternative embodiments are able to use values of β equal to c−(q−p)/p, where c is, for example, 0.5. In such an alternative embodiment, the first filter would include a (q−p)/p phase shift.

The resampling filter coefficient sequence calculation process 800 continues by creating, at step 804, filter coefficients for the current iteration, i.e., iteration "N," so as to create a low pass filter with a group delay corresponding to the above determined $\alpha_n$.

The resampling filter coefficient sequence calculation process 800 continues by updating, at step 806, the group delay to be used to implement the filters for the next input sample to be processed. In one embodiment, the group delay for the filter to be applied to next input sample is based upon a difference of a first data clock rate corresponding to the sample rate of the discrete time signal samples, and a second data clock rate corresponding to a resampled output data clock rate that is fractionally related to the first data clock rate, and is determined according to the equation:

$$\alpha_{n+1} = \alpha_n + \frac{q-p}{p}$$

The resampling filter coefficient sequence calculation process 800 continues by determining, at step 808, if the group delay for the filter to be used to process the next input sample, i.e., $\alpha_{n+1}$ is less than β+(L−1)/2. If that determination is true, the processing increments "n", i.e., the sample number of the sample being processed, and returns to creating the filter, at step 804, to be used to process the next sample.

If the determination of step 808 is not true, the processing skips, at step 812, one data cycle of the first data clock, i.e., CLK1 230, to exclude the next input data sample. The processing then updates, at step 814, the group delay to account for the skipped input sample of the discrete time input signal 232. One embodiment updates the group delay according to the following formula:

$$\alpha_{n+1} = \alpha_n - 1$$

The processing performed at step 814 "resets" the low pass filter's group delay after skipping a sample to perform the data resampling at the lower second clock rate. The processing then increments, at step 810, "n" and returns to creating, at step 804, the filter coefficients for the next input data sample. In one embodiment, the decrease caused by this "reset" substantially corresponds to a total increase in group delay of filters defined by the sequential plurality of finite impulse response filter coefficient sets that are associated with discrete time signal samples occurring between the samples being "skipped" by the processing of that embodiment.

Figure 9:
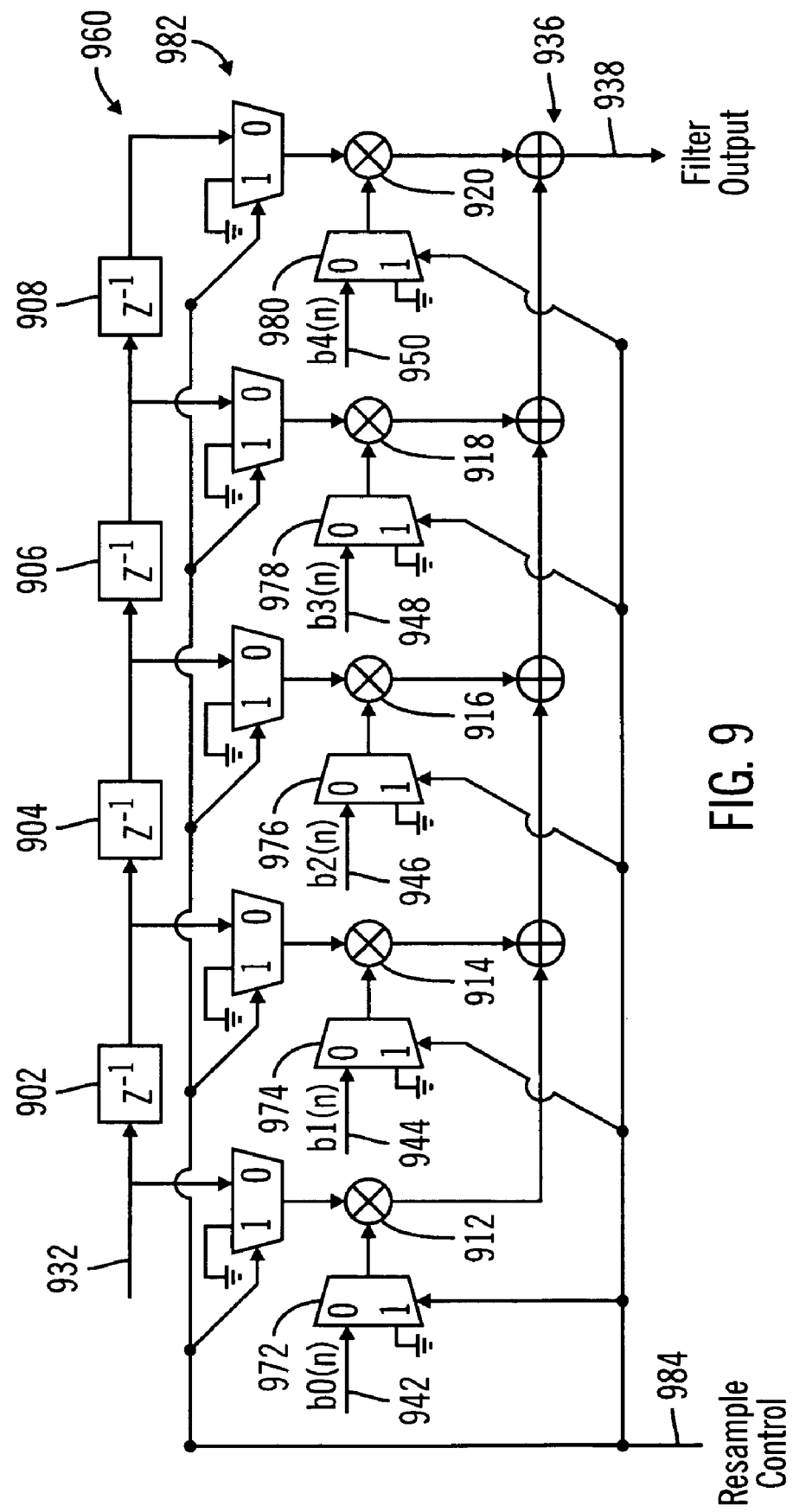
FIG. 9 illustrates a functional block diagram of a gated discrete time processor that receives sampled signals at a first clock rate and produces a filtered resampled output at a second clock rate, in accordance with one embodiment of the invention.

FIG. 9 illustrates a functional block diagram of a gated discrete time processor 900 that receives sampled signals at a first clock rate and produces a filtered resampled output at a second clock rate, in accordance with one embodiment of the invention. The gated discrete time processor 900 illustrates one embodiment of a resampling filter 106 described above.

The gated discrete time processor 900 include a five stage delay line 960 that consists of a first delay element 902, a second delay element 904, a third delay element 906, and a fourth delay element 908. The five stage delay line 960 receives input samples 932 at a first clock frequency and clock those samples through the delay line at that same first clock frequency. The output of the five stage delay line 960 is provided to a five element diplexer 982 that outputs either the output of the five stage delay line 960 or a "0" value based upon the state of a resample control signal 984. The resample control signal 984 in one embodiment corresponds to the resample control signal 720, discussed above, and is a function of the denominator of the resampling ratio. For example, in a configuration with a resampling ratio of 288/325, the resample control signal repeats every 325 input samples where 37 of the 325 samples will be asserted to designate a skipped input sample.

The delay line outputs routed through the five element diplexer 982 are provided to respective coefficient multipliers including a first coefficient multiplier 912, a second coefficient multiplier 914, a third coefficient multiplier 916, a fourth coefficient multiplier 918, and a fifth coefficient multiplier 920. The coefficient multipliers generally multiply a respective delay line output by an appropriate resampling filter coefficient, similar to the resampling filter coefficients described above, to implement proper resample filtering. The resampling filter coefficients, e.g., a first resampling coefficient 942, a second resampling coefficient 944, a third resampling coefficient 946, a fourth resampling coefficient 948, and a fifth resampling coefficient 950 are gated by respective coefficient diplexers, such as a first coefficient diplexer 972, a second coefficient diplexer 974, a third coefficient diplexer 976, a fourth coefficient diplexer 978, and a fifth coefficient diplexer 980. The coefficient diplexers of one embodiment receive the resample control signal 984 and select between the resample filter coefficient being provided to that stage and a "zero" value. When the resample control signal 984 is asserted, both the five element diplexer 982 and the coefficient diplexers output a "0" value and there by provide two inputs with "0" value to their respective coefficient multipliers. Such inputs allow the coefficient multipliers to not operate in that condition and conserve power. Thus the multipliers will be effectively running at the CLK1*p/q rate.

The outputs of the coefficient multipliers is provided to an adder 936 and provided as a resampled output 938. In one embodiment, the five stage diplexer 982, the coefficient multipliers, the coefficient diplexers, and the adder 936 are operated at a second data clock frequency, which corresponds to the resampled output clock frequency. Asserting the resample control during the input sample within the input sample stream 932 that is to be skipped effectively disables data to be output of the resampled output 938, since the five coefficient multipliers each have two "0" valued inputs and output a "0" value.

Figure 10:
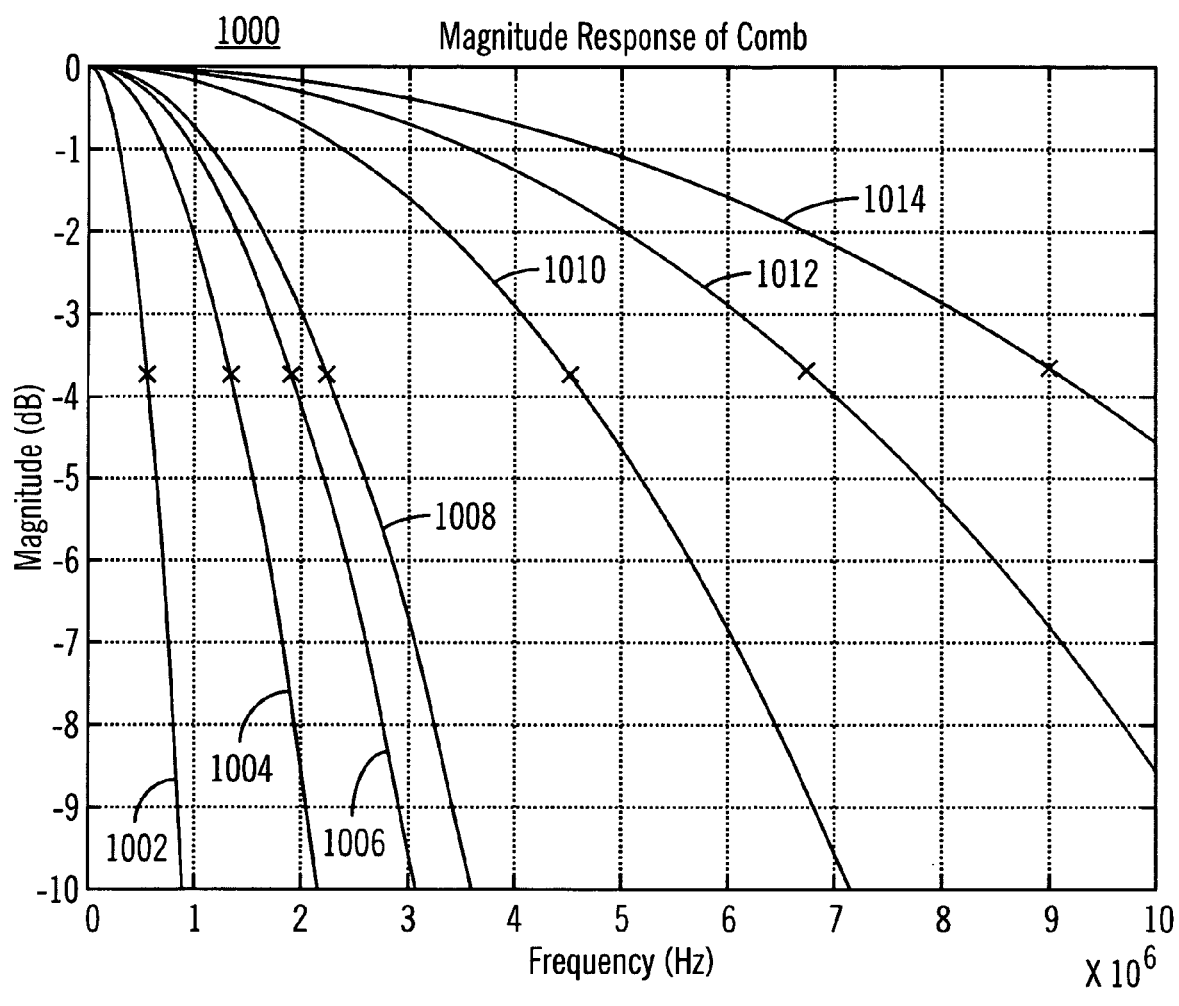
FIG. 10 illustrates a comb filter bandwidth versus signal bandwidth to be processed, in accordance with one embodiment of the present invention.

FIG. 10 illustrates a comb filter bandwidth versus signal bandwidth to be processed 1000, in accordance with one embodiment of the present invention. The comb filter illustrated in the comb filter bandwidth versus signal bandwidth to be processed 1000 chart illustrates the bandwidth of the comb filter contained in the decimation by "n" processing block 104 described above. The comb filter bandwidth versus signal bandwidth to be processed 1000 illustrates seven (7) magnitude responses that correspond to the seven (7) signal bandwidths of signals to be processed by one embodiment of the present invention. The comb filter bandwidth versus signal bandwidth to be processed 1000 includes a first comb filter bandwidth 1002 through a seventh comb filter bandwidth 1014. The first comb filter bandwidth 1002 corresponds to a 1.4 MHz signal bandwidth to be processed. A second comb filter bandwidth 1004 corresponds to a 3 MHz signal bandwidth to be processed. A third comb filter bandwidth 1006 corresponds to a 3G input signal with a 3.84 MHz signal bandwidth to be processed. A fourth comb filter bandwidth 1008 corresponds to a 5 MHz signal bandwidth to be processed. A fifth comb filter bandwidth 1010 corresponds to a 10 MHz signal bandwidth to be processed. A sixth comb filter bandwidth 1012 corresponds to a 15 MHz signal bandwidth to be processed. A seventh comb filter bandwidth 1014 corresponds to a 20 MHz signal bandwidth to be processed. The respective "X" on each of the bandwidth traces corresponds to the channel bandwidth for that example. The comb filter bandwidth versus signal bandwidth to be processed 1000 chart illustrates that the comb filter maintain the desired channel bandwidth for all of these example cases of signals to be processed. It is also to be noted that if these frequency response characteristics are plotted with respect to $f_{bw}/f_s$, the magnitude plots would have an almost identical in-band response.

Although the invention is described herein with reference to specific embodiments, various modifications and changes can be made without departing from the scope of the present invention as set forth in the claims below. For example, further embodiments are able to be realized using programmable logic or reprogrammable processors. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A discrete time signal resampling circuit, comprising:
   a data sample processing module adapted to remove selected samples from a sequential plurality of discrete time signal samples to implement fractional resampling, the selected samples being separated by a inter-removal sample count, the data sample processing module storing a filter length number of samples that is less than the inter-removal sample count;
   a coefficient generator, adapted to generate a sequential plurality of finite impulse response filter coefficient sets, each coefficient set being associated with a respective distinct portion of a plurality of discrete time signal samples consisting of the filter length number of samples, the sequential plurality of finite impulse response filter coefficient sets including at least a first group of coefficient sets that are associated with discrete time signal samples occurring between the selected samples, the first group of coefficient sets defining a sequence of low pass filters, each low pass filter having an increasing group delay relative to an immediately preceding low pass filter;
   a coefficient multiplier adapted to sequentially multiply each coefficient set by its associated respective distinct portion of the plurality of discrete time signal samples and to produce therefrom a product vector; and
   an adder adapted to produce a resampled output sample comprising a sum of elements of the product vector, wherein the data sample processing module operates at a first data clock rate corresponding to a sample rate of the discrete time signal samples, wherein the coefficient generator, the coefficient multiplier and the adder operate at a second data clock rate corresponding to a resampled output data clock rate that is fractionally related to the first data clock rate, and wherein a value of the increasing group delay is equal to a difference of the first data clock rate and the second data clock rate divided by the first data clock rate.

2. The discrete time signal resampling circuit of claim 1, wherein the coefficient generator receives a control signal corresponding to a change in a resampling rate, and wherein the coefficient generator generates, in response to the control signal, a new sequential plurality of finite impulse response filter coefficient sets corresponding to the change in the resampling rate.

3. The discrete time signal resampling circuit of claim 1, further comprising:
   a resample control signal input adapted to receive a resample control signal indicating an occurrence of a selected sample to be removed from the sequential plurality of discrete time signal samples; and
   a filter coefficient gate adapted to set to zero, in response to the resample control signal, a selected coefficient set within the finite impulse response filter coefficient sets wherein the selected coefficient set corresponds to the selected sample to be removed.

4. The discrete time signal resampling circuit of claim 1, further comprising:
   a resample control signal input adapted to receive a resample control signal indicating an occurrence of a selected sample to be removed from the sequential plurality of discrete time signal samples;
   a delay line adapted to store a selected distinct portion of the plurality of discrete time signal samples that are received by the data sample processing module prior to the resample control signal and that correspond to the selected sample to be removed; and
   a data gate adapted to set to zero, in response to the resample control signal, the selected distinct portion of the plurality of discrete time signal samples.

5. The discrete time signal resampling circuit of claim 1, wherein the sequential plurality of finite impulse response filter coefficient sets define a first filter and a second filter occurring immediately subsequent to the first filter, the second filter having a decrease in group delay relative to the first filter, the first filter being applied prior to removal of a first selected sample within the selected samples and the second filter being applied immediately after the removal of the first selected sample.

6. The discrete time signal resampling circuit of claim 5, wherein the decrease substantially corresponds to a total increase in group delay of filters defined by the sequential plurality of finite impulse response filter coefficient sets that are associated with discrete time signal samples occurring between the selected samples.

7. The discrete time signal resampling circuit of claim 6, wherein the decrease is equal to one subtracted from the difference of the first data clock rate and the second data clock rate divided by the first data clock rate.

8. A discrete time signal resampling circuit, comprising:
   a data sample processing module adapted to remove selected samples from a sequential plurality of discrete time signal samples to implement fractional resampling, the selected samples being separated by a inter-removal sample count, the data sample processing module storing a filter length number of samples that is less than the inter-removal sample count;
   a coefficient generator, adapted to generate a sequential plurality of finite impulse response filter coefficient sets, each coefficient set being associated with a respective distinct portion of a plurality of discrete time signal samples comprising the filter length number of samples, the sequential plurality of finite impulse response filter coefficient sets including at least a first group of coefficient sets that are associated with discrete time signal samples occurring between the selected samples, the first group of coefficient sets defining a sequence of low pass filters, each low pass filter having an increasing group delay relative to an immediately preceding low pass filter;
   a coefficient multiplier adapted to sequentially multiply each coefficient set by its associated respective distinct portion of the plurality of discrete time signal samples and to produce therefrom a product vector; and
   an adder adapted to produce a resampled output sample comprising a sum of elements of the product vector,
   wherein the sequential plurality of finite impulse response filter coefficient sets defines a first filter and a second filter occurring immediately subsequent to the first filter, the second filter having a decrease in group delay relative to the first filter, the first filter being applied prior to removal of a first selected sample within the selected samples and the second filter being applied immediately after the removal of the first selected sample, and
   wherein the decrease substantially corresponds to a total increase in group delay of filters defined by the sequential plurality of finite impulse response filter coefficient sets that are associated with discrete time signal samples occurring between the selected samples.

9. The discrete time signal resampling circuit of claim 8, wherein the decrease is equal to one subtracted from the difference of the first data clock rate and the second data clock rate divided by the first data clock rate.

10. The discrete time signal resampling circuit of claim 8, wherein the coefficient generator receives a control signal corresponding to a change in a resampling rate, and wherein the coefficient generator generates, in response to the control signal, a new sequential plurality of finite impulse response filter coefficient sets corresponding to the change in the resampling rate.

11. The discrete time signal resampling circuit of claim 8, further comprising:
   a resample control signal input adapted to receive a resample control signal indicating an occurrence of a selected sample to be removed from the sequential plurality of discrete time signal samples; and
   a filter coefficient gate adapted to set to zero, in response to the resample control signal, a selected coefficient set within the finite impulse response filter coefficient sets wherein the selected coefficient set corresponds to the selected sample to be removed.

12. The discrete time signal resampling circuit of claim 8, further comprising:
   a resample control signal input adapted to receive a resample control signal indicating an occurrence of a selected sample to be removed from the sequential plurality of discrete time signal samples;
   a delay line adapted to store a selected distinct portion of the plurality of discrete time signal samples that are received by the data sample processing module prior to the resample control signal and that correspond to the selected sample to be removed; and a data gate adapted to set to zero, in response to the resample control signal, the selected distinct portion of the plurality of discrete time signal samples.

13. The finite impulse response filter of claim 8, wherein a value of the increasing group delay is based upon a difference of a first data clock rate corresponding to a sample rate of the discrete time signal samples, and a second data clock rate corresponding to a resampled output data clock rate that is fractionally related to the first data clock rate.

14. A method of resampling a discrete time signal sample sequence, the method comprising:
removing, with a data sample processing module, selected samples from a sequential plurality of discrete time signal samples to implement fractional resampling, the selected samples being separated by a inter-removal sample count, the data sample processing module storing a filter length number of samples that is less than the inter-removal sample count;
generating a sequential plurality of finite impulse response filter coefficient sets, each coefficient set being associated with a respective distinct portion of a plurality of discrete time signal samples comprising the filter length number of samples, wherein the sequential plurality of finite impulse response filter coefficient sets includes at least a first group of filter coefficient sets that are associated with discrete time signal samples occurring between the selected samples, the first group of filter coefficient sets defining a sequence of low pass filters, each low pass filter having an increasing group delay relative to an immediately preceding low pass filter, the increasing group delay being based upon a difference of a first data clock rate corresponding to a sample rate of the discrete time signal samples, and a second data clock rate corresponding to a resampled output data clock rate that is fractionally related to the first data clock rate;
multiplying each coefficient set within the sequential plurality of finite impulse response filter coefficient sets by its associated respective distinct portion of the plurality of discrete time signal samples, thereby producing a product vector; and
adding elements of the product vector to produce a resampled output sample,
wherein the sequential plurality of finite impulse response filter coefficient sets define a first filter and a second filter occurring immediately subsequent to the first filter, the second filter having a decrease in group delay relative to the first filter, the first filter being applied prior to removal of a first selected sample within the selected samples and the second filter being applied immediately after the removal of the first selected sample, and
wherein the decrease substantially corresponds to a total increase in group delay of filters defined by the sequential plurality of finite impulse response filter coefficient sets that are associated with discrete time signal samples occurring between the selected samples.

15. The method of claim 14, wherein the removing is performed by processing that operates at a first data clock rate corresponding to a sample rate of the discrete time signal samples, and wherein generating, multiplying and adding operate at a second data clock rate corresponding to a resampled output data clock rate that is fractionally related to the first data clock rate.

16. The method of claim 14, further comprising:
receiving a resample control signal indicating an occurrence of a selected sample to be removed from the sequential plurality of discrete time signal samples; and
setting to zero, in response to the resample control signal, a selected finite impulse response filter coefficient set within the finite impulse response filter coefficient sets wherein the selected finite impulse response filter coefficient set corresponds to the selected sample to be removed.

* * * * *